(12) United States Patent
Filimonov et al.

(10) Patent No.: US 7,365,599 B2
(45) Date of Patent: Apr. 29, 2008

(54) GLITCH-FREE CONTROLLABLE RF POWER AMPLIFIER

(75) Inventors: Nikolai Filimonov, Moscow (RU);
Oleg Varlamov, Moscow (RU);
Grigory Itkin, München (DE)

(73) Assignee: Sony Ericsson Mobile Communications AB, Lund (SE)

( * ) Notice: Subject to any disclaimer, the term of this patent is extended or adjusted under 35 U.S.C. 154(b) by 10 days.

(21) Appl. No.: 10/553,024

(22) PCT Filed: Feb. 23, 2004

(86) PCT No.: PCT/EP2004/001766

§ 371 (c)(1),
(2), (4) Date: Aug. 29, 2006

(87) PCT Pub. No.: WO2004/091097

PCT Pub. Date: Oct. 21, 2004

(65) Prior Publication Data

US 2007/0080746 A1  Apr. 12, 2007

(30) Foreign Application Priority Data

Apr. 9, 2003  (EP) .................................. 03008289

(51) Int. Cl.
*H03F 1/14* (2006.01)
(52) U.S. Cl. .................... 330/51; 330/302; 455/127; 455/343
(58) Field of Classification Search ............... 330/51, 330/302; 455/127, 343
See application file for complete search history.

(56) References Cited

U.S. PATENT DOCUMENTS

| 4,598,252 | A |   | 7/1986 | Andricos ........................ 330/51 |
| 5,296,821 | A |   | 3/1994 | Petersen et al. ............ 330/141 |
| 5,909,643 | A | * | 6/1999 | Aihara ..................... 455/127.3 |
| 5,982,236 | A | * | 11/1999 | Ishikawa et al. ............ 330/296 |
| 6,169,449 | B1 |  | 1/2001 | Hasegawa ..................... 330/51 |

FOREIGN PATENT DOCUMENTS

| EP | 0961 402 A2 | 1/1999 |
| EP | 0977354 A1 | 2/2000 |
| EP | 1229642 A1 | 1/2001 |
| WO | WO 01/67621 A | 3/2001 |

OTHER PUBLICATIONS

International Search Report dated Jun. 3, 2004, corresponding to PCT Application No. PCT/EP2004/001766.

* cited by examiner

Primary Examiner—Michael B Shingleton
(74) Attorney, Agent, or Firm—Myers Bigel Sibley & Sajovec, PA (57) ABSTRACT

A power amplifier circuit for amplifying an input RF signal with respect to a specified RF output power includes an input terminal for supplying the input RF signal to be amplified, an output terminal for the RF signal with the output power specified, an amplification path formed between the input terminal and the output terminal having a power amplification circuit for amplifying the RF signal, a bypass formed between the input terminal and the output terminal for the RF signal to bypass the amplification path, a control terminal for controlling the operation of the amplification path and the bypass, such that an RF signal is either passed through the amplification path or the bypass.

15 Claims, 7 Drawing Sheets

Fig. 7b

GLITCH-FREE CONTROLLABLE RF POWER AMPLIFIER

RELATED APPLICATIONS

The present application is a 35 U.S.C. § 371 national phase application of PCT International Application No. PCT/EP2004/001766, having an international filing date of Feb. 23, 2004, and claiming priority to European Patent Application No. 03008289.5, filed Apr. 9, 2003, the disclosures of which are incorporated herein by reference in their entireties. The above PCT International Application was published in the English language and has International Publication No. WO 2004/091097 A1.

The present invention generally relates to RF power amplifiers for use in wireless mobile telecommunication terminals, particularly to a control of the RF output power of the power amplification stage.

BACKGROUND OF THE INVENTION

In UMTS (Universal Mobile Telecommunications Systems) systems, the wireless mobile telecommunication terminals are called upon to adjust their respective RF (Radio Frequency) output power to the momentarily required level. As a plurality of users share the same band frequencies within a cell of a UMTS system, one users communication signal is the origin of noise for the other communication signals of the respective other users. A power control is therefore necessary to keep the noise level down for the benefit of all users in a cell. In most cases, a mobile terminal is not required to transmit at its maximum RF output power. In the majority of cases, a transmission at lower power levels is sufficient. At these lower power levels the energy consuming high-power stage is typically turned off and bypassed. This saves battery power and increases the on air time of a mobile terminal.

A wireless mobile telecommunication terminal may be any user equipment like e.g. a mobile phone, a Personal Digital Assistant, a wireless remote enquiry measuring apparatus or the like. For convenience, a respective device mobile user equipment is briefly addressed as mobile terminal within the context of this specification.

Figure 1:
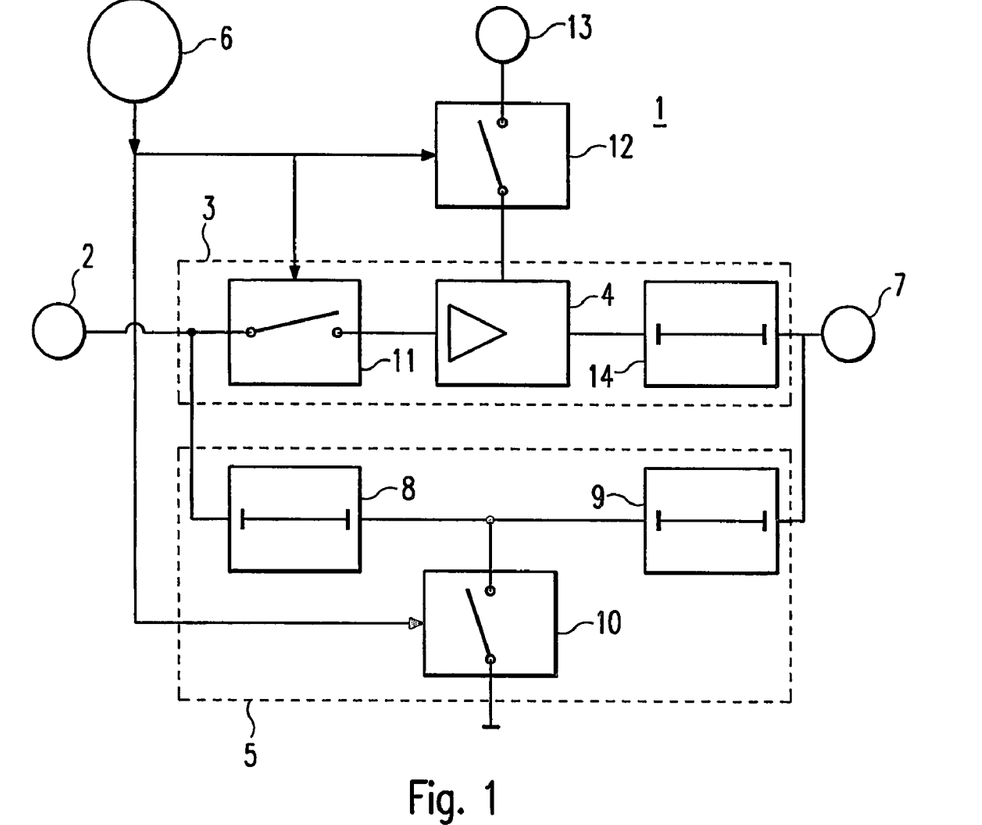
FIG. 1 shows a state of the art bypass RF power amplification circuitry.

An example of a respective bypass architecture of an RF power control on mobile terminals is given in EP 1 229 642 A1. The corresponding circuit diagram is shown in FIG. 1. The power amplifier is basically composed of an amplification path containing an RF power amplifier and a path bypassing the amplifier. In the high output power mode, an input RF signal is amplified by the amplification path, while the bypass will not influence the amplification. In low power mode, an RF input signal passes the circuit through the bypass path practically not affecting the signal power. The power supply to the power amplifier is turned off at the same time for reducing the average energy consumption.

The transmission (TX) circuitry of FIG. 1 allows only a coarse adaptation of the output RF power, i.e. outside a range provided by the amplification path itself. Further, switching between the amplification and the bypass mode results in a short mismatch of the circuit impedance which further causes a glitch in the RF output power. This in turn has a negative impact on the overall transmission conditions in a UMTS system.

SUMMARY OF THE INVENTION

It is therefore an object of the present invention to provide an amplification stage for an RF power transmitter adapted for being used in a mobile terminal, which combines the bypassing technique with a fine adjustment of the RF output power by preventing any power glitches of an RF signal processed.

This object is achieved by the invention as defined in the independent claims. Additional advantageous features of the present invention are claimed in the respective sub-claims.

The present invention achieves the above cited object in particular with a power amplifier circuit for amplifying an input RF signal with respect to a specified RF output power comprising an input terminal for supplying the input RF signal to be amplified, an output terminal for the RF signal with the output power specified, an amplification path formed between the input terminal and the output terminal having a power amplification circuit for amplifying the RF signal, a bypass formed between the input terminal and the output terminal for the RF signal to bypass the amplification path, a control terminal for controlling the operation of the amplification path and the bypass such, that an RF signal is either passed through the amplification path or the bypass. The power amplifier circuit further comprises a variable gain amplifier circuit for a pre-amplification of the input RF signal which is placed between the line from the input terminal to the amplification path and the bypass, and a delay control means for controlling the variable gain amplifier, the amplification path, and the bypass, whereby, before setting the operating conditions of the variable gain amplifier, the amplification path, and the bypass in a state to achieve the RF output power specified, the delay control means is adapted to first set the respective operating conditions in the inverse state thereof.

The above object is further achieved by mobile terminal for a wireless telecommunication system with a power amplifier circuit according to the present invention.

In addition the above object is achieved by a method for amplifying an input RF signal with respect to a specified RF output power, comprising the steps of supplying the input RF signal to be amplified, outputting the RF signal with the output power specified, amplifying the RF signal in an amplification path formed between an input terminal and an output terminal, selectively bypassing the amplification path, controlling the operation of the amplification path and the bypass such that an RF signal is either passed through the amplification path or the bypass. Hereby, the method comprises the steps of pre-amplifying the input RF signal by a variable gain amplifier circuit which is placed between the line from the input terminal to the amplification path and the bypass and controlling the variable gain amplifier, the amplification path, and the bypass by a delay control means, whereby, before setting the operating conditions of the variable gain amplifier, the amplification path, and the bypass in a state to achieve the RF output power specified, the respective operating conditions are at first set in the inverse state thereof via the delay control means.

The present invention advantageously allows a fine adjustment of the RF output power without straining a mobile wireless telecommunication system with glitches, a condition particularly important for a low noise transmission in UMTS systems.

Advantageously, the delay time period for which the delay control means sets the operating conditions of the variable gain amplifier, the amplification path, and the bypass in an opposed way corresponds to half the settling time for an RF output power change, allowing a smooth, completely transient-free change of the RF output value.

The control means effectively comprises a latch trigger circuit for controlling the operation of the amplification path and the bypass, a sample-and-hold circuit for controlling the gain factor of the variable gain amplifier circuit, a digital multiplexer circuit for selecting a control signal, and delay circuit for delaying a control signal by the delay time period. Hereby, the delay circuit will provide a delayed control signal to the multiplexer which then selects the original, undelayed or tile delayed control signal for the sample-and-hold circuit to control the variable gain amplifier circuit and the latch trigger circuit to control the amplification path and the bypass corresponding to the operation conditions required for the inventive RF output power control.

A coarse RF output power control is favourably achieved by the bypass comprising a first matching circuit, a second matching circuit, and a first controllable switch for controllably adapting the impedance of the bypass, the amplification path comprising a third matching circuit and a controllable second switch for controllably adapting the impedance of the amplification path. Such, the RF signal is either amplified by the amplification path or passes the bypass.

The control terminal may suitably be adapted to provide control information to the delay control means for allowing to adjust the delay time period to the settling time of an RF power change. Further, with the variable gain amplifier circuit comprising a digital and/or analogue gain control, a fine tuning of the output RF power is easily achieved.

In a preferred embodiment of the present invention, the input RF signal is a signal coded for use in an UMTS communication system allowing a glitch-free transmission in telecommunication system based on the UMTS standard.

Advantageously the method comprises the step of setting the operating conditions of the variable gain amplifier, the amplification path, and the bypass by the delay control means in the inverse state thereof for a delay time period that corresponds to half the settling time ($\tau$) for an RF output power change.

Further, advantageously the method comprises the step of controlling the operation of the amplification path and the bypass by a latch trigger circuit integrated in the control means, controlling the gain factor of the variable gain amplifier circuit by a sample-and-hold circuit, selecting a control signal by a digital multiplexer circuit, and delaying a control signal by the delay time period by a delay circuit.

Preferably the method comprises the step of controllably adapting the impedance of the bypass to either block or open it for a passage of an RF signal by a first matching circuit, a second matching circuit, and a first controllable switch integrated in the bypass.

In a preferred embodiment the method comprises the step of controllably adapting the impedance of the amplification path to either amplify an RF signal or block the passage for the RF signal by a third matching circuit and a controllable second switch integrated in the amplification path.

Further, the method can comprise the step of adapting the control terminal to provide control information to the delay control means.

BRIEF DESCRIPTION OF THE DRAWINGS

In the following description, the present invention is explained in more detail and in relation to the enclosed drawings, in which.

DETAILED DESCRIPTION OF THE EMBODIMENTS

FIG. 1 shows a block diagram of a prior art power amplifier circuit 1 with a bypass for controlling the RF output power. The circuitry 1 is basically composed of an amplifying path 3 and a bypass 5.

The amplifying path 3 is built-up by a power amplifier circuit 4 which is preceded by a controllable second switch 11 for connecting and disconnecting it, respectively, from the input terminal 2. A third matching circuit 14 connects the output of the power amplifier circuit 4 to the output terminal of the power amplifier circuit 1.

The bypass 5 arranged in parallel to the amplifying path 3 contains a first matching circuit 8 followed by a second matching circuit 9. A controllable first switch 10 in the bypass allows to put the line between the first and second matching circuit on ground potential.

A power supply terminal 13 allows to apply a supply voltage to the power amplifier circuit 4. The application of the supply voltage can be interrupted by means of a third switch 12 which, like the second 11 and first switch 10 is controlled by a control terminal 6.

In amplifying or high power mode, respectively, an RF signal is amplified by the amplification path 3, while the bypass 5 does not influence the operation of the amplification path 3. In bypass or low power mode, respectively, an RF signal applied to the input terminal 2 passes the power amplifier circuit 1 through the bypass 5 with practically no losses in signal power. The amplification path 3 does in this mode not affect the operation of the bypass 5. Moreover, a reduction of the energy consumption is achieved by opening the third switch 12, thus cutting off the supply voltage from the power amplifier circuit 4.

Figure 2:
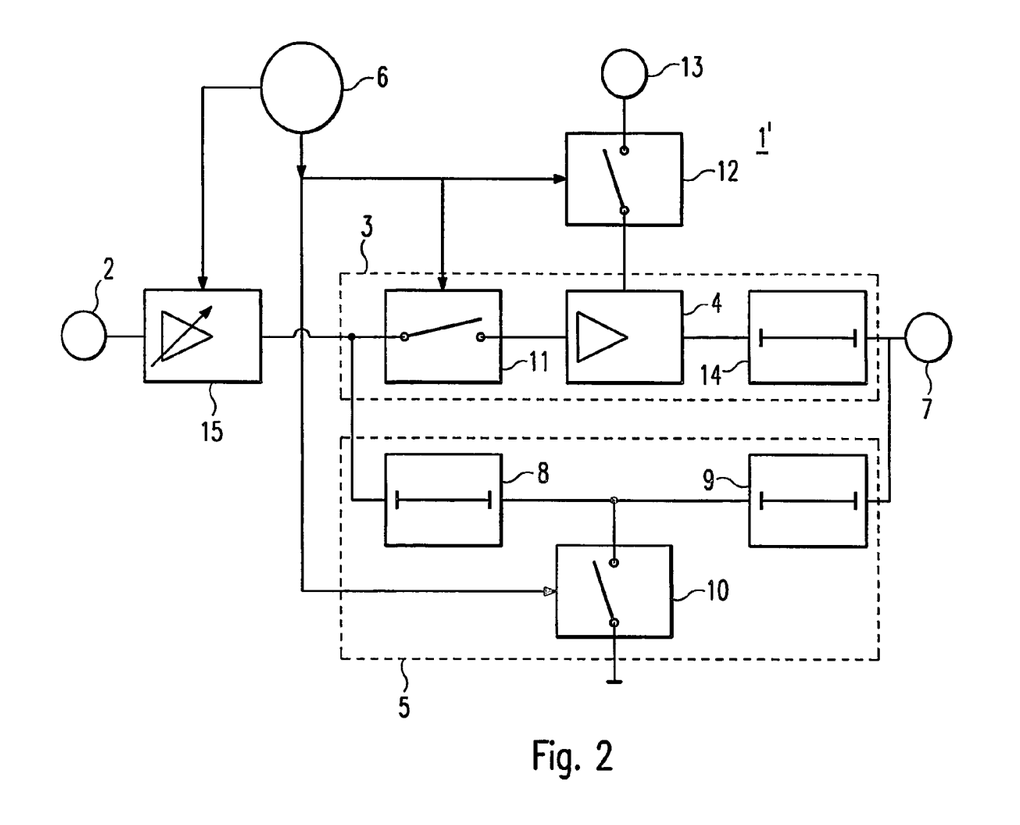
FIG. 2 shows the circuitry of FIG. 1 extended by a Variable Gain Amplifier circuit.

As only a very coarse control of the RF output power is achievable with a power amplifier circuit 1 as described, it is proposed according to the present invention to place a Variable Gain Amplifier (VGA) circuit 15 between the input terminal 2 and the line to the amplifying path 3 and bypass 5. The VGA circuit 15 be adapted for a digital or analogue gain control to enable a pre-amplification of the input RF signal within a wide range. A respective control signal is provided from the control terminal 6.

Figure 3:
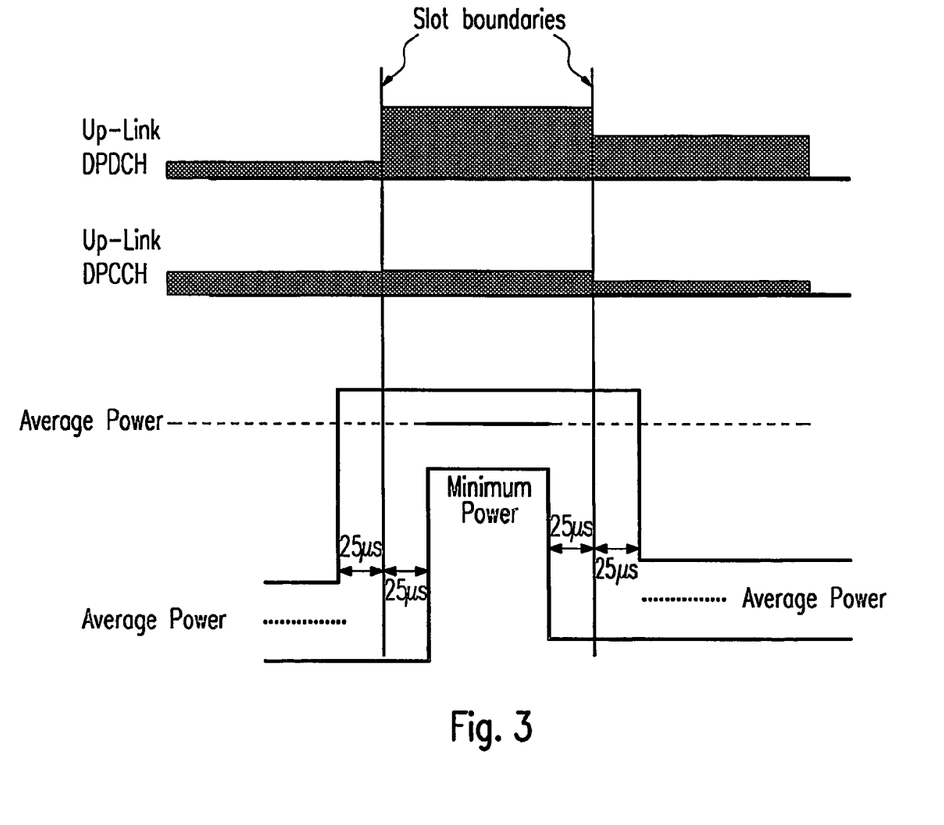
FIG. 3 shows the power template according to ETSI TS 125.101.

In some applications, like e.g. for controlling the TX path of a mobile terminal in an UMTS system, the output power is usually not controlled by its average value, but by its time template as for instance the ETSI TS 125.101, ETSI ZS 134.121 standard or the like. For a UMTS compatible mobile terminal operating in FDD (Frequency Division Duplex) mode, the output power should be modified according to the power template ETSI TS 125.101 as shown in FIG. 3. The RF transmission power may be varied for each time slot of the UMTS. The user data are transmitted via a Dedicated Physical Data Channel (DPDCH) shown as the up-link DPDCH while the control data are transmitted via a Dedicated Physical Control Channel (DPCCH) shown as up-link DPCCH. The corresponding variation of the RF output power with each slot is shown for both channels at the lower half of FIG. 3. As can be seen from FIG. 3, the increase of the output power for the data channel encompasses the time slot with a leader and a delay of 25 μs. For the control channel its the time slot which encompasses the period for the output power increase. The respective average power levels are indicated as a dashed line for the DPDCH and as an interrupted dotted line for the DPCCH.

Figure 4A:
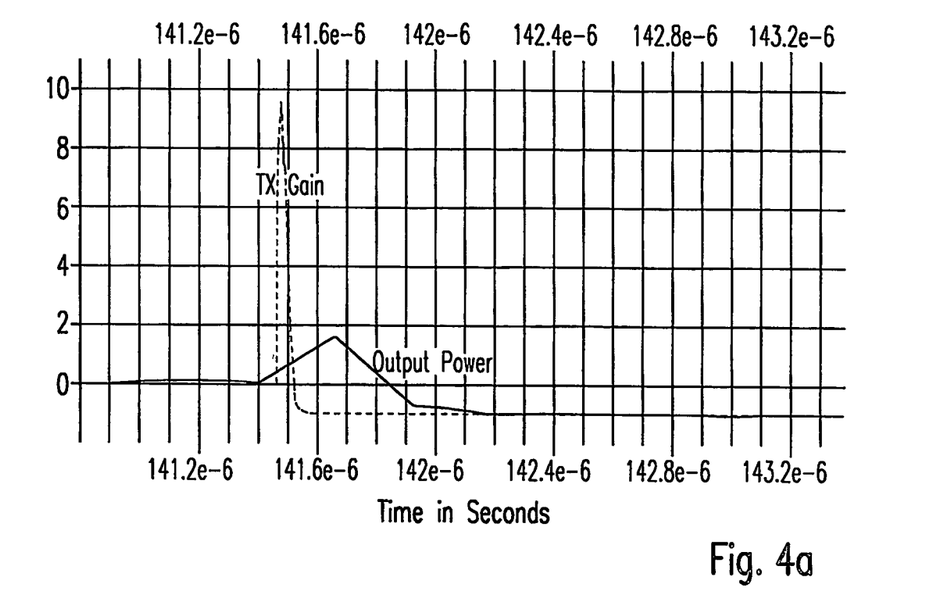
FIG. 4a shows the response of the output power of the circuitry according to FIG. 2 to a PA/Bypass change coinciding with a Change Gain command when switching from high to low output power.
Figure 4B:
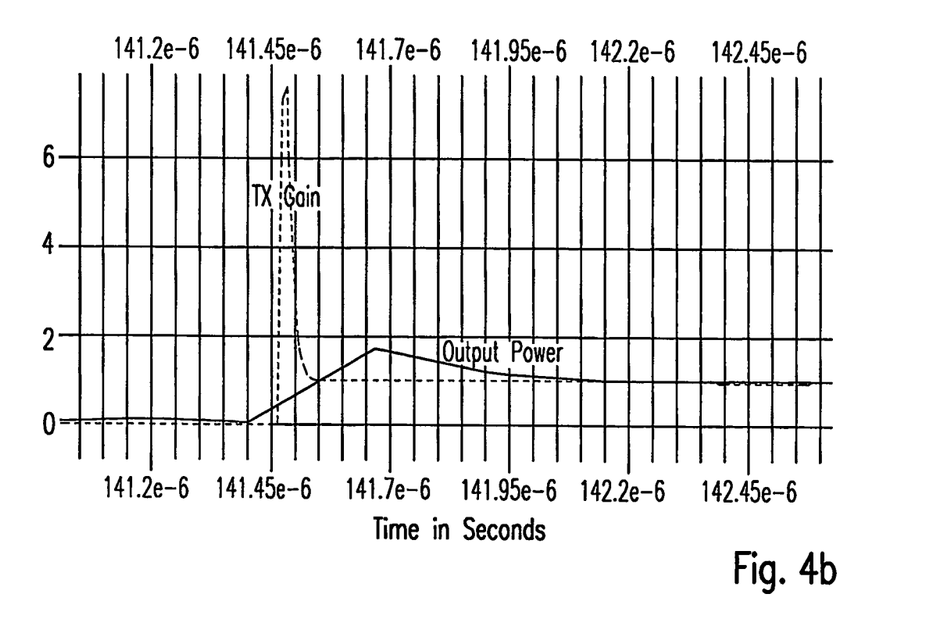
FIG. 4b shows the response of the output power of the circuitry according to FIG. 2 to a PA/Bypass change coinciding with a Change Gain command when switching from low to high output power.

Referring to the block diagram of FIG. 2, when the command 'PA/Bypass' to change the operating mode of the power amplifier circuit 1' from amplifying to bypassing or vice versa coincides with a 'change gain' command applied to the VGA, the output power changes as shown in FIGS. 4a, 4b. The situation for changing from high output power to low output power mode is shown in FIG. 4a, the situation for the reverse mode change in FIG. 4b. The representations of FIG. 4a and 4b are, like that of the corresponding figures below, based on a simulation performed with 'System View'. In both cases, the gain factor of the power amplifier circuit 1' TX shows a short positive transient spike of around 8 dB before it relaxes to the desired value. The output power reacts with a corresponding but much longer building-up transient showing a positive overshoot of about 2 dB which lasts for about 500 ns before it settles to the new value. The time necessary for the RF output power to settle to the desired value is usually denoted as settling time τ. The transient forms a glitch which strains the transmission system resulting in an increased overall noise.

Figure 5A:
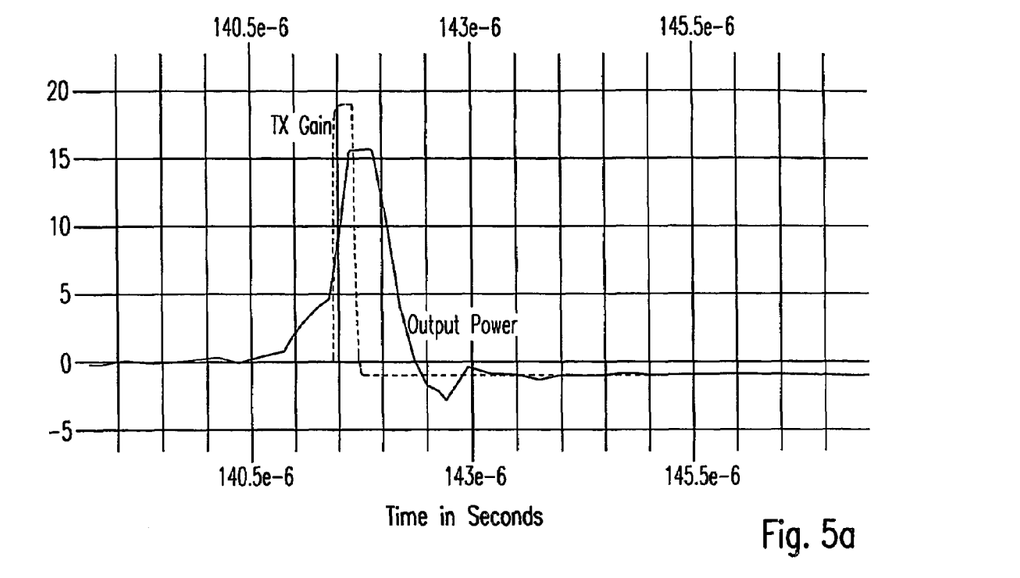
FIG. 5a shows the response of the output power of the circuitry according to FIG. 2 to a PA/Bypass change delayed to a Change Gain command when switching from high to low output power.
Figure 5B:
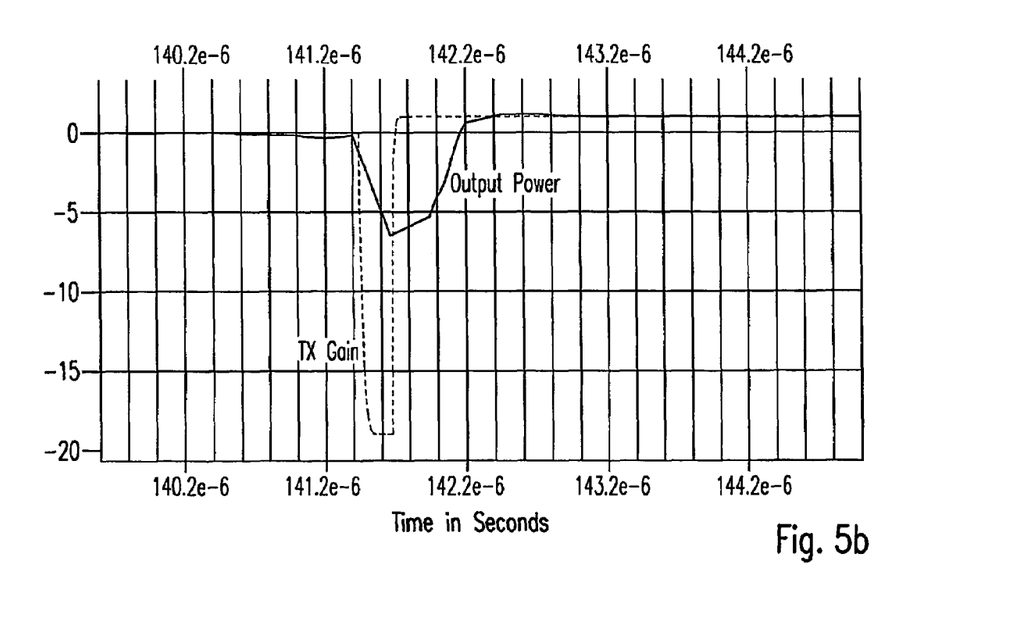
FIG. 5b shows the response of the output power of the circuitry according to FIG. 2 to a PA/Bypass change delayed to a Change Gain command when switching from low to high output power.

In a second scenario, the 'PA/Bypass' mode change command is initiated delayed to a VGA change command with a delay time being equivalent or more than the settling times in each block. The situation for the delay time being longer than the settling time in each block is illustrated in FIG. 5a for the high to low power output mode change and for the reverse mode change in FIG. 5b. The resulting output power overshoot is with more than 16 dB in the first case much higher than for the synchronous gain switching of FIG. 4. Also the power overshoot in the second case exceeds that of the synchronous situation and shows further negative values.

A glitch-free smooth change of the output power will only be achieved when the time delay between the 'PA/Bypass' change mode command and the VGA gain change command is less or equivalent to half settling time duration in both blocks. A corresponding simulation is illustrated for the high-to-low and the low-to-high mode change in FIGS. 7a and 7b, respectively.

To achieve a respective glitch-free, smooth change of the RF output power, the timing of the 'PA/Bypass' mode change command and the VGA tuning or gain change command, respectively, should be controlled to co-operate such, that the first command sequence to reduce the full TX gain is followed with a time delay of half the settling time by the second command sequence to full TX gain increase.

Figure 7A:
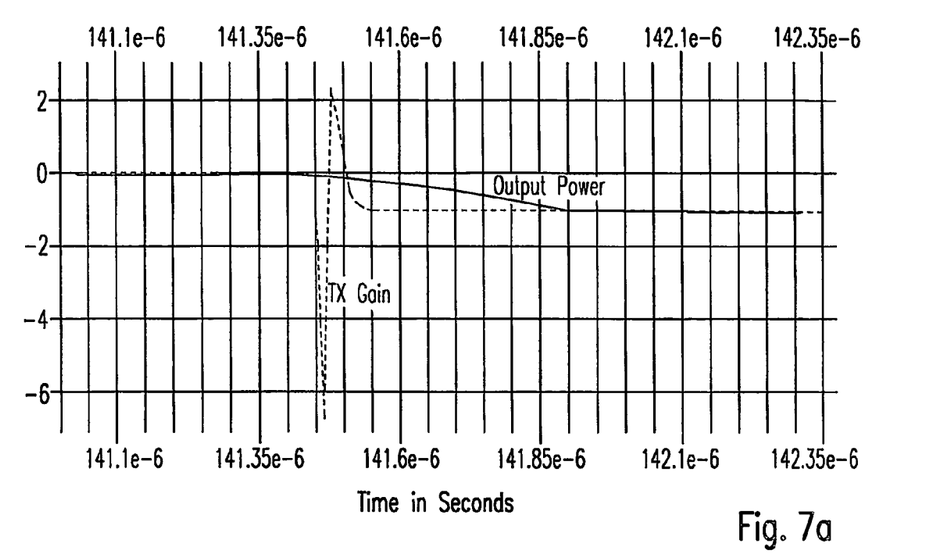
FIG. 7a shows the smooth output power change achieved with the circuitry according to FIG. 6 when switching from high power mode to low power mode.
Figure 7B:
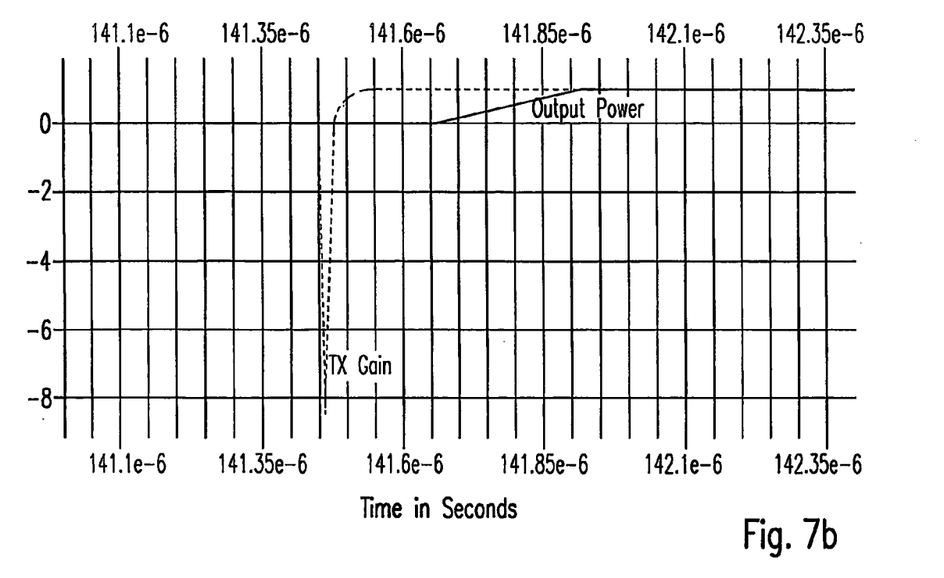
FIG. 7b shows the smooth output power change achieved with the circuitry according to FIG. 6 when switching from low power mode to high power mode.

In the case of increasing the RF output power shown in FIG. 7b, the first command sequence is made up of the initiating 'VGA gain reduce' command triggering the gain reduction of the VGA. This is followed by the control terminal 6 sending a 'PA/Bypass Mode change' command with value 'Bypass' to control the switches 10, 11, and 12 of the power amplifier circuit 1' such, that the RF Signal passes the bypass 5. The second command sequence starts with 'common gain increase', which will send a 'PA/Bypass Mode change' command of value 'PA' to control the switches 10, 11, and 12 of the power amplifier circuit 1' such, that the RF Signal passes the amplification path 3.

In the case of reducing the RF output power as shown in FIG. 7a, the first command sequence is made up of the initiating 'VGA gain increase' command triggering the gain raise of the VGA. This is followed by the control terminal 6 sending a 'PA/Bypass Mode change' command with value 'PA' to control the switches 10, 11, and 12 of the power amplifier circuit 1' such, that the RF Signal passes the amplification path 3. The second command sequence starts with 'common gain decrease', which will send a 'PA/Bypass Mode change' command of value 'Bypass' to control the switches 10, 11, and 12 of the power amplifier circuit 1' such, that the RF Signal passes the bypass 5.

Figure 6:
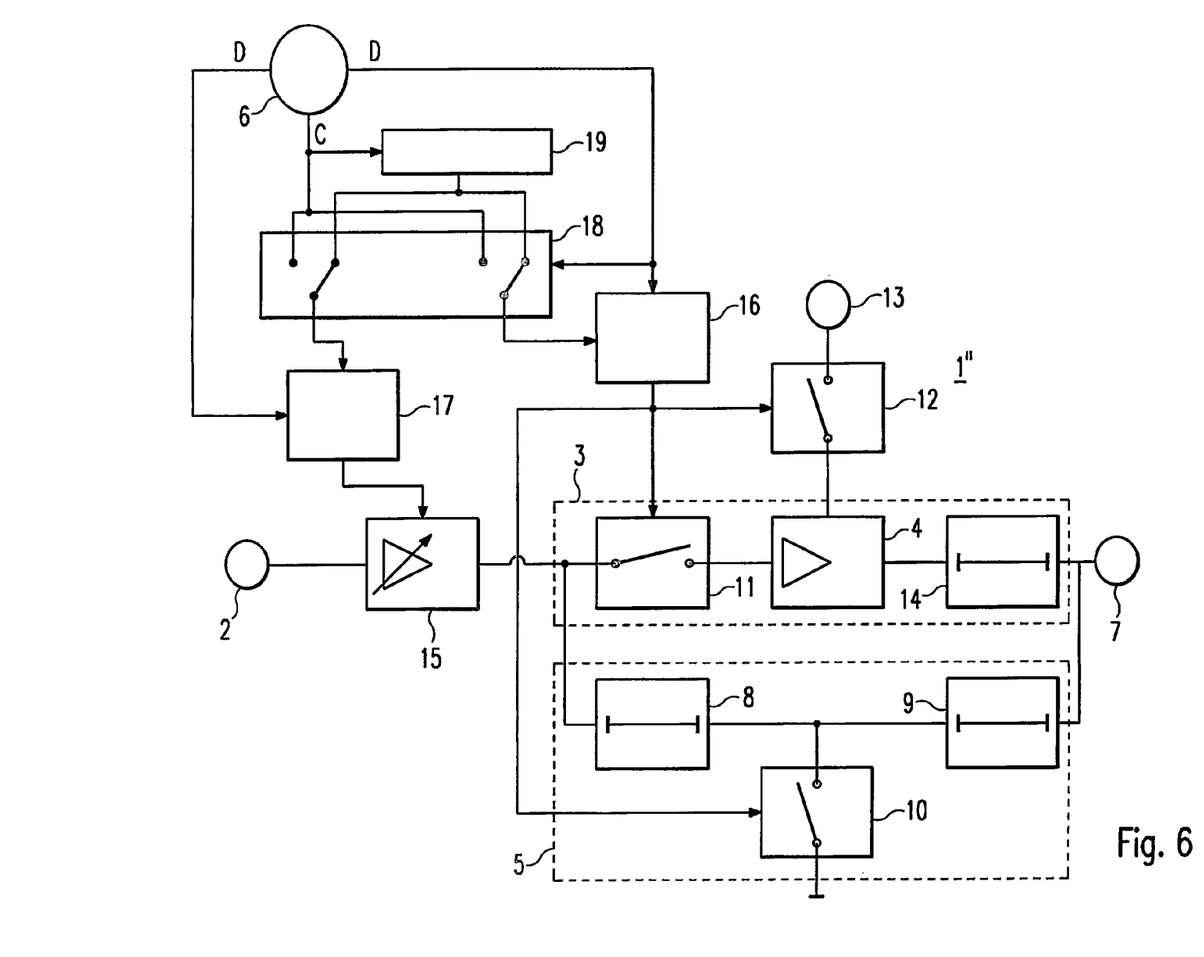
FIG. 6 shows a block diagram of a bypass RF power amplification circuitry according to the present invention.

To realise a respective power changing mode, the power amplifier circuit 1' of FIG. 2 is extended by a delay control unit according to the circuit architecture shown in the block diagram of FIG. 6. The delay control unit is formed by a latch trigger circuit 16, a sample-and-hold circuit 17, a digital multiplexer circuit 18, and delay circuit 19. The resulting power amplifier circuit 1" allows to control the required RF output power at the output terminal 7 in the same coarse way than the prior art circuit architecture of FIG. 1, but additionally provides a fine tuning of the RF output power like the circuitry of FIG. 2 combined with a glitch-free RF output power change.

From the control terminal 6 a control line triggered by the rising edge of the system clock supplies the delay circuit 19 and the multiplexer 18. A first dataline allows to set the multiplexer 18 to either forward the original or the delayed control signal to the sample-and-hold circuit 17 and the latch trigger circuit 16. The first dataline is further used to set the latch trigger circuit 16 such, that the first 10, second 11, and third 12 switch are set to the respectively required switching state. A second dataline sends the command values to the sample-and-hold circuit 17 which controls the gain of the VGA.

The signal delay in the delay circuit 19 is set to half the settling time τ. When the RF output power is to be increased, first a 'VGA gain reduce' command is sent from the control terminal 6 via the datalines to the sample-and-hold circuit 17 and the multiplexer 18. The multiplexer 18 is set to forward the original control signals and the sample-and-hold circuit 17 will therefore immediately reduce the gain factor of the VGA as desired. Next, a 'PA/Bypass Mode change' command with value 'Bypass' from the control terminal 6 will cause the latch trigger circuit 16 to set the first 10, second 11, and third 12 switch such, that the RF Signal passes the power amplifier circuit 1" through the bypass. With the following command procedure 'common gain increase', a 'PA/Bypass Mode change' command of value 'PA' causes the multiplexer 18 to change its state for forwarding the delayed control signal. The latch trigger circuit 16 is further set to control the first 10, second 11, and third 12 switch such, that the RF Signal passes the power amplifier circuit 1" through the amplifying path 3.

For the RF output power to be reduced, first a 'VGA gain increase' command is sent from the control terminal 6 via the datalines to the sample-and-hold circuit 17 and the multiplexer 18. The multiplexer 18 is set to forward the original control signals and the sample-and-hold circuit 17 will therefore immediately increase the gain factor of the VGA as desired. Next, a 'PA/Bypass Mode change' command with value 'PA' from the control terminal 6 will cause the latch trigger circuit 16 to set the first 10, second 11, and third 12 switch such, that the RF Signal passes the power amplifier circuit 1" through the amplifying path 3. With the next following command procedure 'common gain decrease', a 'PA/Bypass Mode change' command of value 'Bypass' causes the multiplexer 18 to change its state to now forward the delayed control signal. The latch trigger circuit 16 is further set to control the first 10, second 11, and third 12 switch such, that the RF Signal passes the power amplifier circuit 1" through the bypass.

A preferred embodiment of the present invention is formed by a mobile terminal for use in a wireless mobile telecommunication system with a power amplification circuit 1" according to the specified above. A corresponding mobile terminal advantageously allows a fine adjustment of the RF output power without straining a mobile wireless telecommunication system with glitches, a condition particularly important for a low noise transmission in UMTS systems.

The invention claimed is:

1. A power amplifier circuit for amplifying an input RF signal with respect to a specified RF output power, comprising
   an input terminal for supplying the input RF signal to be amplified;
   an output terminal for the RF signal with the output power specified;
   an amplification path formed between the input terminal and the output terminal having a power amplification circuit for amplifying the RF signal;
   a bypass formed between the input terminal and the output terminal for the RF signal to bypass the amplification path;
   a control terminal for controlling the operation of the amplification path and the bypass, such that an RF signal is either passed through the amplification path or the bypass;
   a variable gain amplifier circuit for pre-amplification of the input RF signal which is placed between the line from the input terminal to the amplification path and the bypass; and
   a delay control means for controlling the variable gain amplifier, the amplification path, and the bypass, such that when the RF output power of the RF signal is to be increased, a variable gain of the variable gain amplifier circuit is reduced before operating conditions of the amplification path and the bypass are set, after a delay time period, to a state in which the RF signal is passed through the amplification path to achieve the output power specified, and vice versa when the RF output power of the RF signal is to be reduced.

2. A power amplifier circuit according to claim 1, wherein the delay time period corresponds to half a settling time ($\tau$) for an RF output power change.

3. A power amplifier circuit according to claim 1, wherein the delay control means comprises:
   a latch trigger circuit for controlling the operation of the amplification path and the bypass;
   a sample-and-hold circuit for controlling the gain factor of the variable gain amplifier circuit;
   a digital multiplexer circuit for selecting a control signal; and
   a delay circuit for delaying a control signal by a delay time period.

4. A power amplifier circuit according to claim 1, wherein the bypass comprises:
   a first matching circuit;
   a second matching circuit; and
   a first controllable switch for configuring an impedance of the bypass to control passage of the RF signal.

5. A power amplifier circuit according to claim 1, wherein the amplification path comprises:
   a third matching circuit; and
   a controllable second switch for adjusting an impedance of the amplification path to either amplify the RF signal or block the passage of the RF signal.

6. A power amplifier circuit according to claim 1, wherein the control terminal is configured to provide control information to the delay control means.

7. A power amplifier circuit according to claim 1, wherein the variable gain amplifier circuit comprises a digital and/or analogue gain control.

8. A power amplifier circuit according to claim 1, wherein the input RF signal is a signal coded for use in an UMTS communication system.

9. A mobile terminal for a wireless telecommunication system comprising a power amplifier circuit according to claim 1.

10. A method for amplifying an input RF signal with respect to a specified RF output power, comprising:
    supplying the input RF signal to be amplified;
    outputting the RF signal with the output power specified;
    amplifying the RF signal in an amplification path formed between an input terminal and an output terminal;
    selectively bypassing the amplification path using a bypass;
    controlling operation of the amplification path and the bypass such that an RF signal is either passed through the amplification path or the bypass;
    pre-amplifying the input RF signal by a variable gain amplifier circuit which is placed between the line from the input terminal to the amplification path and the bypass; and
    controlling the variable gain amplifier the amplification path, and the bypass by a delay control means, such that when the RF output power of the RF signal is to be increased, a variable gain of the variable gain amplifier circuit is reduced before operating conditions of the amplification path and the bypass are set, after a delay time period, to a state in which the RF signal is passed through the amplification path to achieve the output power specified, and vice versa when the RF output power of the RF signal is to be reduced.

11. A method according to claim 10, wherein the delay time period corresponds to half a settling time ($\tau$) for an RF output power change.

12. A method according to claim 10, wherein operating the delay control means comprises:

controlling operation of the amplification path and the bypass by a latch trigger circuit integrated in the control means;

controlling the gain factor of the variable gain amplifier circuit by a sample-and-hold circuit selecting a control signal by a digital multiplexer circuit; and delaying a control signal by a delay time period by a delay circuit.

13. A method according to claim 10, wherein selectively bypassing the amplification path comprises:

adjusting an impedance of the bypass to control passage of an RF signal using a first matching circuit, a second matching circuit, and a first controllable switch integrated in the bypass.

14. A method according to claim 10, wherein amplifying the RF signal comprises:

adjusting an impedance of the amplification path to either amplify an RF signal or block the passage of the RF signal using a third matching circuit and a controllable second switch integrated in the amplification path.

15. A method according to claim 10, wherein controlling operation of the amplification path comprises:

configuring a control terminal to provide control information to the delay control means.

* * * * *